(12) United States Patent
Paillet et al.

(10) Patent No.: US 7,102,951 B2
(45) Date of Patent: Sep. 5, 2006

(54) OTP ANTIFUSE CELL AND CELL ARRAY

(75) Inventors: Fabrice Paillet, Hillsboro, OR (US);
Ali Keshavarzi, Portland, OR (US);
Muhammad M. Khellah, Tigard, OR (US); Dinesh Somasekhar, Portland, OR (US); Yibin Ye, Portland, OR (US);
Stephen H. Tang, Pleasanton, CA (US);
Mohsen Alavi, Portland, OR (US);
Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/979,605

(22) Filed: Nov. 1, 2004

(65) Prior Publication Data

US 2006/0092742 A1 May 4, 2006

(51) Int. Cl.
*G11C 17/18* (2006.01)
(52) U.S. Cl. .................................. 365/225.7; 365/205
(58) Field of Classification Search ............. 365/225.7, 365/205
See application file for complete search history.

(56) References Cited

U.S. PATENT DOCUMENTS 6,240,033 B1 * 5/2001 Yang et al. ............... 365/225.7
6,515,344 B1   2/2003 Wollesen
6,686,791 B1   2/2004 Zheng et al.
6,693,481 B1   2/2004 Zheng
6,788,607 B1 * 9/2004 Duval et al. ............. 365/225.7

OTHER PUBLICATIONS

Keshavarzi, Ali et al., U.S. Appl. No. 10/954,537, entitled "Crosspoint Memory Array Utilizing One Time Programmable Antifuse Cells," filed Sep. 29, 2004.
Keshavarzi, Ali et al., U.S. Appl. No. 11/027,476, entitled "One Time Programmable Memory," filed Dec. 28, 2004.
Paillet, Fabrice et al., U.S. Appl. No. 10/956,285, entitled "Non Volatile Data Storage Through Dielectric Breakdown", filed Sep. 30, 2004.

* cited by examiner

*Primary Examiner*—Tuan T. Nguyen
(74) *Attorney, Agent, or Firm*—Erik R. Nordstrom

(57) ABSTRACT

Different embodiments of a one-time-programmable antifuse cell included. In one embodiment, a circuit is provided that includes an antifuse element, a high voltage device, and a sense circuit. The antifuse element has a voltage supply terminal to be at a sense voltage during sensing/reading and a higher programming voltage during programming. The sense circuit is configured to enable programming the antifuse element during programming and to sense the state of the antifuse element during sensing. The high voltage device is coupled between the antifuse element and the sense circuit to couple the antifuse element to the sense circuit during programming and sensing and to protectively shield the sense circuit from the higher programming voltage during programming.

27 Claims, 3 Drawing Sheets

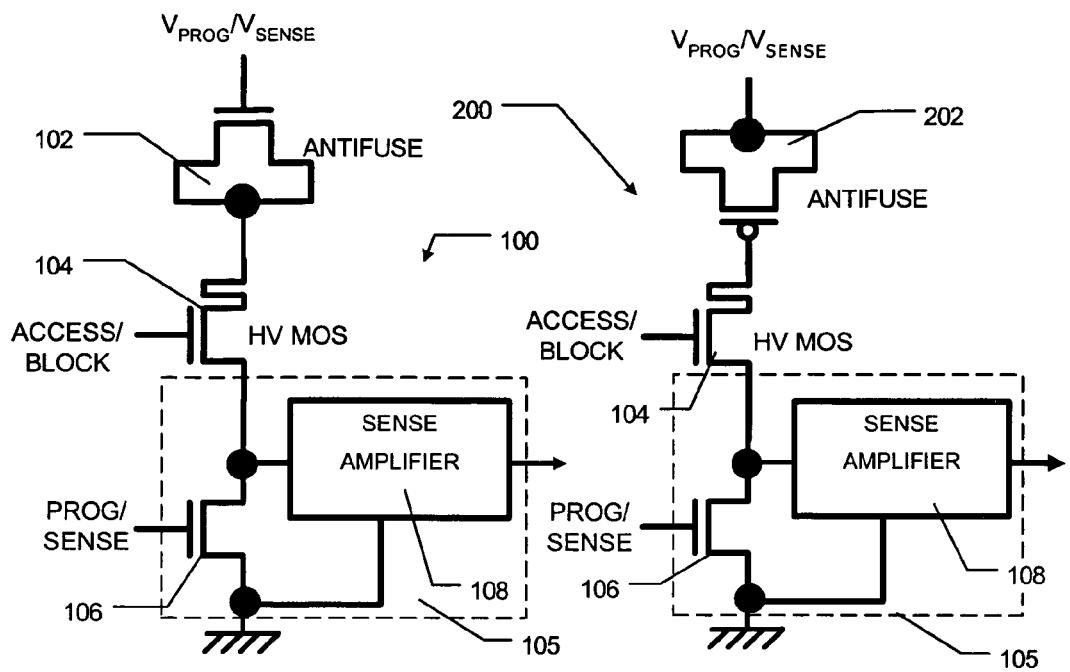
FIGURE 1
FIGURE 2
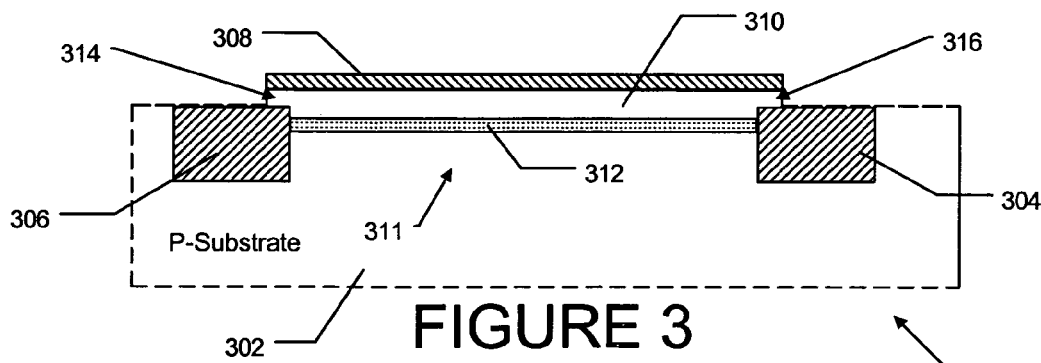
FIGURE 3
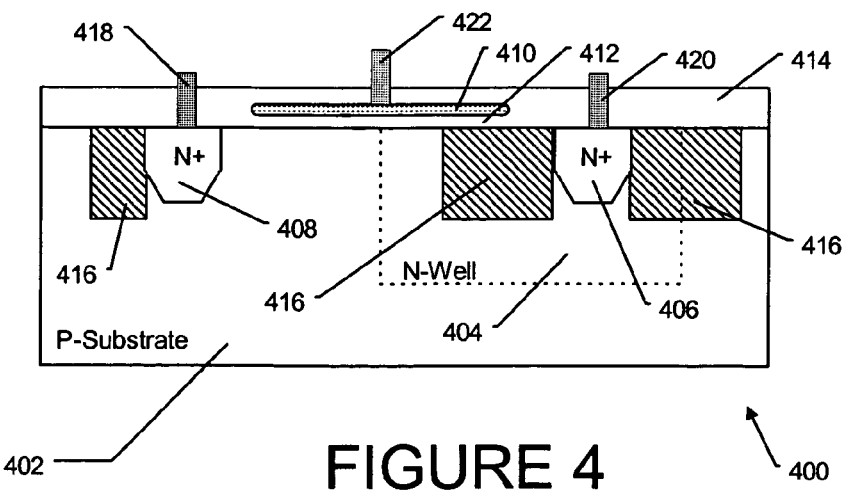
FIGURE 4

OTP ANTIFUSE CELL AND CELL ARRAY

TECHNICAL FIELD

Various embodiments of the invention relate generally to integrated circuit chips and in particular to one time programmable circuits.

BACKGROUND

One time programmable ("OTP") cells are used in integrated circuit ("IC") devices for a variety of applications including OTP memory applications. They may be used as a single memory cell, or in arrays of memory cells to provide unique die/chip IDs and to set operating parameters such as clock multipliers and voltage levels for devices such as microprocessors. They may also be used to configure, customize, and repair a chip after testing (e.g., to repair a processor chip's cache memory array). OTP cells are typically implemented using charge storage, fuse, or antifuse approaches. Charge storage approaches have typically involved defining a bit value based on charge stored on an insulated metal oxide semiconductor ("MOS") type gate structure. Such charge storage approaches, however, are not practicable with current and future deep sub-micron technologies that feature very thin gate oxide because of the high gate leakage current that prevents a long retention time of the information.

On the other hand, fuse and antifuse solutions are more reliable with such technologies. A fuse (or anti-fuse) link can be used to indicate a logic level (e.g., a High or Low level) depending on whether or not it is "blown" or left in its normal state. The natural state of a fuse is closed, but when it is blown (or burned), its resistance is increased to an open state (relative to its normal, closed state). In contrast, an antifuse is blown closed, with its natural state being an open circuit (relative to its normal, open state). A fuse or antifuse can thus be used to establish a logic level whose value depends upon whether it is blown or left in its normal state. Unfortunately, materials such as polysilicon and metals (used for fuses) and amorphous silicon (used for antifuses) require excessive voltages and currents (e.g., potentials exceeding 10 volts at currents greater than 10 Amps) for reliable programming. This is problematic because it means that large, robust transistor circuits are needed in each cell for reliable fuse/anti-fuse programming that does not do damage to surrounding, more sensitive circuitry. Another drawback is that the blowing of such fuse/antifuse structures is unreliable because it is not cumulative; if a device does not blow correctly the first time, it generally cannot be further blown by applying the programming current again. As a result, a certain redundancy is required to compensate for the portion of fuses/antifuses that don't blow correctly at the first try. A further drawback is that the difference of resistance between such blown and non-blown fuse/antifuse structures can be quite small (typically less than an order of magnitude), which makes it difficult to design a sensing scheme that operates reliably through process and temperature variations.

As silicon manufacturing technologies scale, the thickness of the oxide layer isolating the gate of MOS transistors scale. As a result, it has become feasible to break down this oxide by applying a sufficiently high voltage (e.g., 3 V or higher) across the oxide layer. Accordingly, oxide layers are now being used to implement antifuse elements. They are naturally open but when broken down, become closed. (For examples of oxide layers used as antifuse elements, see U.S. Pat. No. 6,686,791 to Zheng et al. and U.S. Pat. No. 6,515,344 to Wollesen.) Unfortunately, even though the required voltage to break down the gate oxide has diminished (e.g., reduced from 10 V to 3V), it still presents a danger to the fragile transistors of the circuit surrounding the oxide element being programmed. This means that the surrounding transistors should be sufficiently protected from the high programming voltages. Accordingly, disclosed herein are improved circuits for implementing antifuse cells and cell arrays using oxide (or other dielectric materials) as antifuse elements.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1 illustrates an OTP circuit utilizing an NMOS antifuse device according to some embodiments of the present invention.

FIG. 2 illustrates one embodiment of an OTP circuit utilizing a PMOS antifuse device.

FIG. 3 illustrates a cross-sectional view of one embodiment of an NMOS transistor suitable for use as an antifuse element.

FIG. 4 illustrates a cross-sectional view of one embodiment of a vertical-drain NMOS (VDNMOS) transistor suitable for use as a high voltage device.

DETAILED DESCRIPTION

Figure 5:
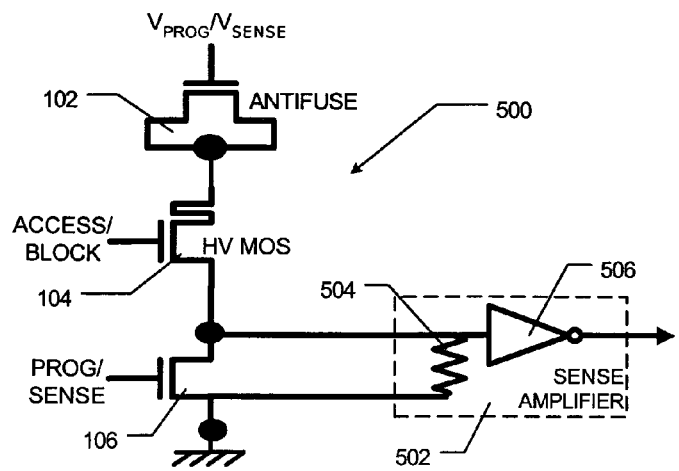
FIG. 5 illustrates the OTP circuit of FIG. 1 utilizing a sense amplifier circuit according to one embodiment of the present invention.

This disclosure provides improved, less-complicated solutions for using antifuse elements such as gate oxide structures to form one or more one time programmable ("OTP") antifuse cells in integrated circuit chips. In one embodiment, a high voltage device such as a vertical drain NMOS ("VDNMOS") transistor is used as a shielding device positioned between an antifuse element on one of its sides and a sense circuit coupled on its other side to protectively isolate the more sensitive sense circuit (along with other downstream circuitry if present) from the antifuse element, which may be exposed to a relatively high programming voltage (during programming or in program mode) if it is to be blown. The OTP antifuse cell can be utilized in a variety of IC devices such as a processor, controller or chip set device to provide OTP memory capability without the need for larger and/or more complex memory circuitry. At the same time, MOS structures (e.g., transistors, diodes, capacitors) already being used in a semiconductor device can be utilized to implement the disclosed antifuse cell embodiments without process modification.

FIGS. 1 and 2 show antifuse cell circuits 100 and 200, respectively, according to two embodiments of the present invention. (The circuits are the same except that an NMOS antifuse element 102 is used in FIG. 1, while a PMOS antifuse element 202 is used in the circuit of FIG. 2. Because the circuits are the same (except for their particular antifuse element) only the circuit with reference to FIG. 1 will be described.

With reference to FIG. 1, antifuse cell 100 comprises an NMOS antifuse element 102, a high voltage device 104, and a sense circuit 105 formed from a program/sense NMOS transistor 106 and a sense amplifier 108. The MOS antifuse device 102 has two terminals, one coupled to a voltage supply, $V_{SENSE}/V_{PROG}$ terminal, and the other coupled to the high voltage device 104. In the depicted embodiment, the antifuse cell is used in a MOS logic circuit operating with a Vcc of about 1.2 V. Accordingly, the voltage supply terminal ($V_{SENSE}/V_{PROG}$) is set at about 1.2 V during sensing (reading) and in excess of about 3 V during programming. (It should be recognized that the circuits and concepts discussed herein are applicable in systems having other supply, sensing, and/or programming voltages.) The high voltage device 104 is positioned between the antifuse element 102 and the sense circuit 105 to protectively shield it from the high programming voltage. The depicted program/sense transistor 106 is an NMOS transistor with the sense amplifier 108 coupled at its drain.

An ACCESS/BLOCK signal is applied at the input of the high voltage device 104 to controllably couple the antifuse element 102 to the sense circuit 105. In one embodiment, the ACCESS/BLOCK signal is at a level (e.g., Vcc) sufficient to couple the antifuse element 102 to the sense circuit 105 during both programming and sensing operations. With the depicted embodiment, a vertical drain NMOS ("VDNMOS") transistor is used to implement the high voltage device 104 and thus, the ACCESS/BLOCK signal is applied to the gate of the VDNMOS transistor 104. A VDNMOS transistor (described in greater detail below) is an asymmetrical transistor that is able to accept a higher than normal maximum operating voltage (e.g., in excess of 1.2 V) at its drain terminal. Thus, it is able to accept the high programming voltage applied at its drain if (and when) the antifuse element 102 is blown. With its drain-to-source resistance made sufficiently high, relative to that of the program/sense transistor 106, a sufficient portion of the program voltage is dropped across it thereby preventing the program/sense transistor 106 from being subjected to a detrimental portion of the program voltage. In addition, because the ACCESS/BLOCK signal does not exceed Vcc, the VDNMOS transistor 104 cannot turn on if a voltage equal to or higher than Vcc is imparted at its source, thereby preventing higher than Vcc voltages from reaching the program/sense transistor 106 and sense amplifier 108. (It should be appreciated that the high voltage device 104 may be formed from any suitable device or device combination for coupling the antifuse element to the sense circuit including but not limited to VDNMOS transistors or any other high voltage transistor such as, for example, a vertical source drain MOS transistor or a vertical source PMOS transistor, with its drain and source terminals reversed from those of the depicted VDNMOS device 104.)

A PROG/SENSE control signal is input at the gate of the program/sense transistor 106 to turn it on when the antifuse is to be programmed and to turn it off during sensing when the antifuse is to be sensed. During programming when the high $V_{PROG}$ voltage is applied at the voltage supply terminal, both the high voltage device and program/sense transistor 106 are "on" thereby causing the high program voltage to be applied across the antifuse element 102, which is initially open. A current path is provided from the antifuse element 102 to ground through the high voltage device 104 and program/sense transistor 106. Thus, as the antifuse element breaks down, current is tunneled through it until its resistance is sufficiently reduced (i.e., until it is "blown"). During sensing, on the other hand, the lower $V_{SENSE}$ voltage is applied at the antifuse element voltage supply terminal, and the program/sense transistor 106 is turned off, which forces current passing through the antifuse element (if it has been blown) to flow substantially into the sense amplifier 108.

The sense amplifier 108 serves to effectively measure the antifuse element current and generate a signal indicative of its programmed state, e.g., whether it was left open or blown closed. With additional reference to FIG. 5, one embodiment of a sense amplifier circuit 502 for implementing the sense amplifier 108 is depicted in an antifuse cell circuit 500. The sense amplifier 502 includes a resistor 504 coupled to the high voltage device 104 and an inverter 506 coupled with its input coupled to the node of the resistor common to the high voltage device 104. Resistor 504, which may be formed from a conventional resistor-coupled MOS transistor, is designed to have a resistance that produces, during sensing, a voltage at the inverter 506 input that is sufficiently high to assert the inverter when the antifuse has been blown and sufficiently low to negate the inverter when the antifuse has been left open. The inverter 506 can be implemented with any suitable device (or device combination) including, for example, a conventional inverter formed from PMOS and NMOS transistors coupled with their gates and drains coupled together.

It should be appreciated that even though a current measuring sense amplifier is shown and described, any other suitable sensing approach could be used. For example, instead of being turned off during sensing, the program/sense transistor could be maintained on (for both sensing and programming) and designed to produce a voltage at its drain to be directly measured by the sense amplifier 108. It is thus contemplated that a variety of sense circuit 105 configurations could be employed with different embodiments of the present invention.

With reference to FIG. 3, a cross-sectional view of an NMOS transistor 300 is depicted. It will be discussed in connection with its use as an antifuse element such as the NMOS element 102 of FIG. 1. NMOS transistor 300 is formed on a P-type substrate 302. (As used herein, the term "substrate" denotes a semiconductor substrate or an epitaxial layer formed on the semiconductor substrate.) It comprises a drain 304 and a source 306 formed from doped, N+ regions deposited on the substrate 302, along with a gate 308 (such as a polysilicon gate) formed atop an oxide layer 310 positioned over a channel region 311 spaced between the drain 304 and source 306. At one end 314, the oxide layer partially overlaps the source 306, while at its other end 316, the oxide layer partially overlaps the drain 304. In the depicted embodiment, the oxide layer is generally between 30 and 70 Ang. thick, but as indicated in the drawing, is thinner at its edges 314, 316 where it overlaps the source and drain, respectively. When a positive voltage (relative to the source 306) is applied at the gate 308, a charge carrying inversion layer 312 is formed within the channel 311. With the drain/source coupled together, a MOS capacitor is thus formed with the gate 308 serving as one electrode; the drain/source (and inversion layer when the device is biased "on") serving as the other electrode; and the oxide layer serving as the capacitor dielectric. The antifuse elements (102, 202) are formed in this way. Ideally, with either device, the transistor is configured to be turned on (e.g., biased in a pinch-off mode), which makes it easier to drive sufficient current through the gate oxide during programming with a lower programming voltage. (It is believed that this is so because it reduces the diode effect needed to be overcome, and it provides for a larger electrode surface thereby reducing the lengths of the overall tunneled pathways formed in the oxide.) Accordingly, as depicted in FIGS. 1 and 2, the NMOS device (102) is arranged with its gate coupled to the supply voltage terminal, while the PMOS is arranged with its gate coupled to the high voltage device and its source/drain terminal coupled to the voltage supply.

The anti-fuse element is programmed by applying a programming voltage (e.g., 3 V) at the gate and source/drain terminals (across the oxide layer 310) to break it down, thereby forming one or more permanent charge carrier tunnels through the oxide layer to form a conductive path through it. One advantage of using an oxide as an antifuse element in this way is that the breakdown process is cumulative. That is, if the device is not sufficiently broken down (low enough resistance) after initial programming, it can be broken down further until a desired conductivity across the oxide layer is attained. It has been observed that with oxide antifuse elements, a difference in resistivity of a broken versus an unbroken antifuse element can be achieved in the range of three to four orders of magnitude, which is sufficient to achieve a robust sensing scheme.

Different current and voltage levels may be required for different oxide materials and dimensions but with typical transistor configurations, passing a current of about 1 milliamp between the gate and source/drain will usually suffice to breakdown the gate oxide for a desired OTP antifuse application. (This will vary depending on the amount of time that the current is passed through the oxide layer, the particular type of oxide or other dielectric material used, the particular dimensions of the gate oxide material, and the desired decrease in oxide layer resistance. For example, it is believed that the oxide breakdown normally occurs at the overlap edges of the oxide 314, 316, where it is at its thinnest. Thus, the oxide layer dimensions should be considered; an oxide layer with "thin" edges may "break" easier, i.e., with less voltage and/or current or for a smaller programming time duration. On the other hand, it may not be as durable in maintaining its programmed resistance.)

It should be appreciated that any suitable oxide (or gate dielectric) material could be used to implement an antifuse element. While $SiO_2$ is primarily used as a gate dielectric for most IC applications, other dielectric materials could also be used to form antifuse elements. For example, as semiconductor devices scale, better dielectric materials such as Al2O3, ZrO and TiO may be used in the future due to their higher permittivities, which allows them to provide greater field strength with thicker dimensions thereby making them less susceptible to undesired oxide breakdown. Such gate dielectric materials could be used to form antifuse elements depending upon their breakdown characteristics. Likewise, while a MOS capacitor is used in the depicted embodiment as the antifuse element, any other suitable antifuse structure such as an oxide layer formed between conductor terminals and made specifically for the purpose of implementing an antifuse element could also be used; however, it may be simpler and more efficient from a production standpoint to use available transistor structures.

FIG. 4 illustrates a cross-sectional view of one embodiment of a vertical-drain NMOS (VDNMOS).transistor such as the one used to implement high voltage device 104 in FIG. 1. As shown in FIG. 4, an N-well 404 is formed on a P-substrate 402, and shallow trench isolation (STI) regions 416 are formed to provide isolation of various regions formed in the P-substrate 402. The N-well 404 may be formed in the P-substrate 402 through ion implantation and/or diffusion of dopant(s) having the N-type conductivity, which is opposite that of the substrate 402. The STI regions 416 may be formed in the N-well 404 through chemical etching and filling therein with an insulation material, such as oxide. A gate electrode 410 is formed on an upper portion of the N-well 404 and the P-substrate 402, and may be formed by depositing a N-type polysilicon layer on the upper portions of the N-well 404 and the P-substrate 402. Diffusion regions 406 and 408 are formed in the N-well 420 and in the P-substrate 402 at portions near the edge of the gate electrode 410 to serve as drain and source regions, respectively. Such diffusion regions 406 and 408 may be heavily doped with N+ dopant(s) to improve contact resistance between a metal layer which forms metal lines 420 and 418. A gate oxide layer 412 is disposed underneath the gate electrode 410. The gate oxide layer 412 may exhibit a thickness of approximately 20–30 Ang. to offer enhanced programming capability. An insulation layer 414 is deposited on the substrate 402. Such an insulation layer 414 may be silicon oxide deposited over the entire surface of the substrate 402, or "grown" using, for example, a rapid thermal processing (RTP) tool. Alternatively, the insulation layer 414 may be silicon nitride or other insulation material that is either grown or deposited on the entire surface of the substrate 402.

Figure 6:
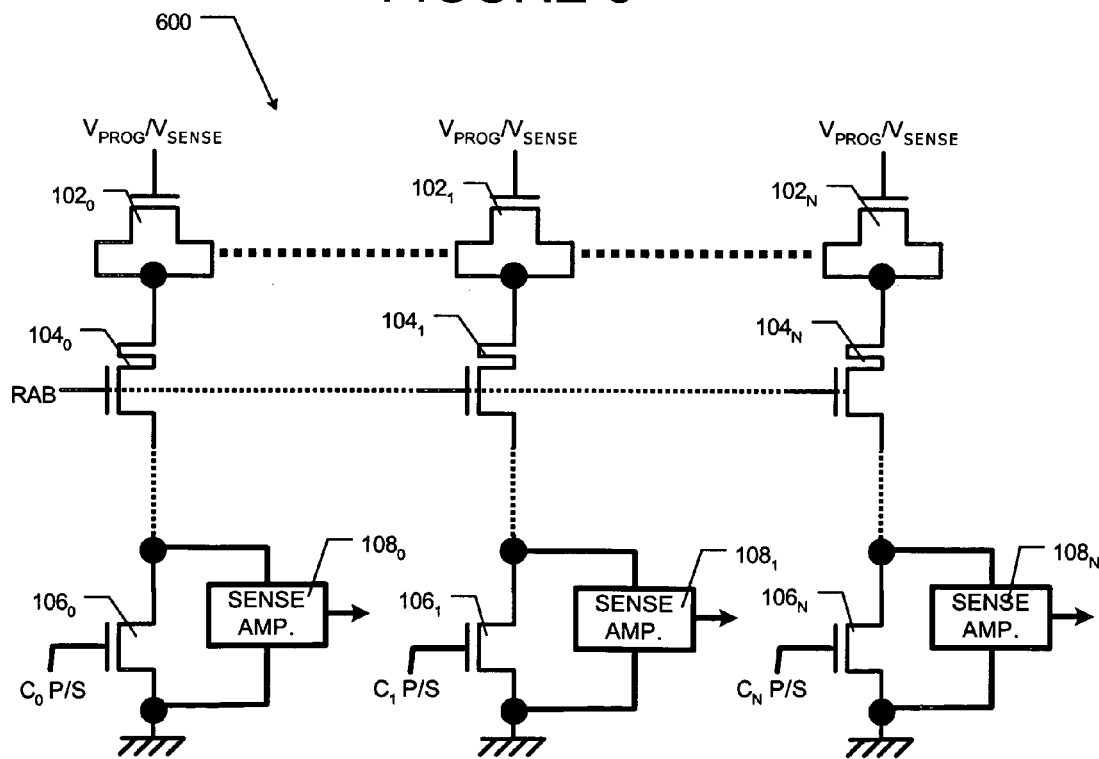
FIG. 6 shows a memory array with a plurality of OTP antifuse cells.

With reference to FIG. 6, an OTP antifuse array 600 according to one embodiment of the present invention is depicted. (It should be noted that only one row of antifuse cells is represented.) the depicted row includes antifuse elements, $102_0$–$102_N$, high voltage devices, $104_0$–$104_N$, program/sense transistors, $106_0$–$106_N$, and sense amplifiers, $108_0$–$108_N$. As shown in the drawing, the individual cells are configured and operate like antifuse cell 100 of FIG. 1, except that only one sense circuit (program/sense transistor and sense amplifier) is used for each column. The high voltage device control inputs for the entire row are coupled together and coupled to a RAB (row access/block) select signal for activating the row of high voltage devices when asserted. The other cells (not depicted) for each column need only an antifuse element and a high voltage device with the high voltage devices in each column all coupled to a common sense circuit. A separate $C_iP/S$ (column program/sense) select signal is applied to the gate of the program/sense transistor $106i$ for each column. In operation, the RAB signal functions as a row select signal during sensing and programming to enable a particular row of cells, while the $C_iP/S$ signal functions as a column select signal to enable sensing and programming for a particular column. By asserting these signals for an appropriate row and column, any antifuse element within the entire array can be separately programmed or sensed. On the other hand, if desired, antifuse elements in different columns can be simultaneously programmed or sensed with the depicted configuration by asserting multiple $C_iP/S$ signals.

ADDITIONAL REMARKS

It should be appreciated that the present invention is applicable for use with all types of semiconductor integrated circuit ("IC") chips that may be fabricated using complementary metal-oxide semiconductor ("CMOS") technology. Examples of these IC chips include but are not limited to processors, controllers, chip set components, programmable logic arrays (PLA), and memory chips.

Figure 7:
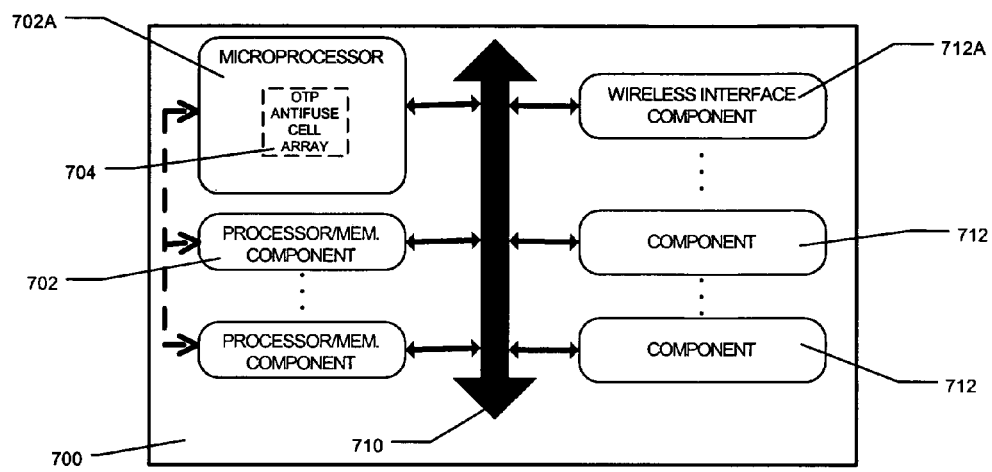
FIG. 7 is a block diagram of a computer system with a chip comprising an antifuse cell array in accordance with some embodiments of the present invention.

With reference to FIG. 7, one example of a system (a system 700 for a computer) for using such an IC chip (a microprocessor chip 702A) is shown. System 700 generally comprises one or more processor/memory components 702, an interface system 710, and one or more other components 712. At least one of the one or more processor/memory components 702 is communicatively coupled to at least one of the one or more other components 712 through the interface system 710, which comprises one or more interconnects and/or interconnect devices including point-to-point connections, shared bus connections, and combinations of the same.

A processor/memory component is a component such as a processor, controller, memory array, or combinations of the same contained in a chip or in several chips mounted to the interface system or in a module or circuit board coupled to the interface system. Included within the depicted processor/memory components is microprocessor chip 702A, which has an OTP antifuse cell array 704 with at least one antifuse cell configured in accordance with an OTP antifuse cell discussed herein. The one or more depicted other components 712 could include any component of use in a computer system such as a sound card, network card, Super I/O chip, or the like. In the depicted embodiment, the other components 612 include a wireless interface component 712A, which serves to establish a wireless link between the microprocessor 702A and another device such as a wireless network interface device or a computer. It should be noted that the system 700 could be implemented in different forms. That is, it could be implemented in a single chip module, a circuit board, or a chassis having multiple circuit boards. Similarly, it could constitute one or more complete computers or alternatively, it could constitute a component useful within a computing system.

While the inventive disclosure has been described in terms of several embodiments, those skilled in the art will recognize that the invention is not limited to the embodiments described, but can be practiced with modification and alteration within the spirit and scope of the appended claims. For example, while an antifuse cell having just two (on/off) states is primarily discussed, an antifuse element, as disclosed herein, could be used to represent one of multiple (more than two) states. The antifuse element's resistance could be progressively reduced a desired amount to come within one of a multiplicity of predefined value ranges corresponding to a multiplicity of states. Its resistance could then be measured to determine its particular programmed state.

Moreover, it should be appreciated that example sizes/models/values/ranges may have been given, although the present invention is not limited to the same. As manufacturing techniques (e.g., photolithography) mature over time, it is expected that devices of smaller size could be manufactured. With regard to description of any timing or programming signals, the terms "assertion" and "negation" are used in an intended generic sense. More particularly, such terms are used to avoid confusion when working with a mixture of "active-low" and "active-high" signals, and to represent the fact that the invention is not limited to the illustrated/described signals, but can be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An integrated circuit chip comprising:
    an antifuse element having a voltage supply terminal to be at a sense voltage during sensing and a higher programming voltage during programming;
    a sense circuit to enable programming the antifuse element during programming and to sense a state of the antifuse element during sensing; and
    a high voltage device coupled between the antifuse element and the sense circuit to electrically couple the antifuse element to the sense circuit during programming and sensing and to protectively shield the sense circuit from the higher programming voltage during programming.

2. The integrated circuit chip of claim 1, in which the antifuse element comprises a MOS field effect transistor with its source and drain coupled together.

3. The integrated circuit chip of claim 2, in which the MOS transistor is a PMOS transistor with its drain and source coupled to the voltage supply terminal.

4. The integrated circuit chip of claim 1, in which the sense circuit comprises a program/sense transistor coupled in series with the high voltage device to enable programming when it is turned on.

5. The integrated circuit chip of claim 4, in which the sense circuit includes a sense amplifier coupled in series with the high voltage device to sense the state of the antifuse element during sensing.

6. The integrated circuit chip of claim 5, in which the sense amplifier is coupled across the program/sense transistor to sense the state of the antifuse element when the program/sense transistor is turned off during sensing.

7. The integrated circuit chip of claim 6, in which the sense amplifier comprises a resistor coupled across the program/sense transistor to substantially shunt current passing through the antifuse element when the program/sense transistor is turned off during sensing to provide a voltage for determining the state of the antifuse element.

8. The integrated circuit chip of claim 4, in which the sense circuit includes a resistor coupled in series with the high voltage device to provide a voltage for the sensing of the state of the antifuse element.

9. The integrated circuit chip of claim 1, in which the high voltage device is a high voltage transistor.

10. The integrated circuit chip of claim 9, in which the high voltage transistor is a vertical drain NMOS field effect transistor.

11. An integrated circuit chip, comprising:
    a plurality of columns of one or more antifuse cells, each cell having: (i) an antifuse element with a first, voltage supply terminal and a second terminal, the first terminal to be at a sense voltage during sensing and a higher programming voltage during programming, and (ii) a high voltage device coupled to the antifuse element at its second terminal; and a sense circuit coupled to each high voltage device in the column, each high voltage device being configured to selectively couple its coupled antifuse element to the sense circuit during programming and sensing and to protectively shield the sense circuit from the programming voltage applied to its coupled antifuse element during programming when it is selected.

12. The integrated circuit chip of claim 11, in which the sense circuit in each column is configured to enable its associated column of antifuse cells for programming and sensing.

13. The integrated circuit chip of claim 12, in which the antifuse cells in the plurality of columns are configured into one or more rows with the high voltage devices in each row coupled to receive a common selection signal for enabling the antifuse cells in the associated row.

14. The integrated circuit chip of claim 11, in which each antifuse element comprises a MOS field effect transistor with its source and drain coupled together.

15. The integrated circuit chip of claim 14, in which each MOS transistor is a PMOS transistor with its drain and source coupled to a voltage supply terminal.

16. The integrated circuit chip of claim 11, in which each sense circuit comprises a program/sense transistor coupled in series with the high voltage device to enable programming when it is turned on.

17. The integrated circuit chip of claim 16, in which each sense circuit includes a sense amplifier coupled in series with the high voltage device to sense the state of its associated antifuse element during sensing.

18. The integrated circuit chip of claim 17, in which each sense amplifier is coupled across its associated program/sense transistor to sense the state of an associated antifuse element when the program/sense transistor is turned off during sensing.

19. The integrated circuit chip of claim 18, in which each sense amplifier comprises a resistor coupled across its associated program/sense transistor to substantially shunt current passing through a selected associated antifuse element when the program/sense transistor is turned off during sensing to provide a voltage for determining the state of the selected, associated antifuse element.

20. The integrated circuit chip of claim 11, in which each high voltage device is a high voltage transistor.

21. The integrated circuit chip of claim 20, in which each high voltage transistor is a vertical drain NMOS field effect transistor.

22. A computer system comprising:

a processor having an OTP antifuse cell array with at least one OTP antifuse cell including: (i) an antifuse element having a voltage supply terminal to be at a sense voltage during sensing and a higher programming voltage during programming; (ii) a sense circuit to enable programming the antifuse element during programming and to sense a state of the antifuse element during sensing; and (iii) a high voltage device coupled between the antifuse element and the sense circuit to electrically couple the antifuse element to the sense circuit during programming and sensing and to protectively shield the sense circuit from the programming voltage during programming; and a wireless interface component coupled to the processor.

23. The computer system of claim 22, in which the antifuse element comprises a MOS field effect transistor with its source and drain coupled together.

24. The computer system of claim 23, in which the MOS transistor is a PMOS transistor with its drain and source coupled to the voltage supply terminal.

25. The computer system of claim 22, in which the sense circuit comprises a program/sense transistor coupled in series with the high voltage device to enable programming when it is turned on.

26. The computer system of claim 25, in which the sense circuit includes a sense amplifier coupled in series with the high voltage device to sense the state of the antifuse element during sensing.

27. The computer system of claim 26, in which the sense amplifier is coupled across the program/sense transistor to sense the state of the antifuse element when the program/sense transistor is turned off during sensing.

* * * * *